United States Patent
Yun

(10) Patent No.: US 12,513,867 B2
(45) Date of Patent: Dec. 30, 2025

(54) ELECTRONIC CONTROL UNIT

(71) Applicant: LG ELECTRONICS INC., Seoul (KR)

(72) Inventor: Donghwa Yun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 169 days.

(21) Appl. No.: 18/378,205

(22) Filed: Oct. 10, 2023

(65) Prior Publication Data
US 2025/0089222 A1    Mar. 13, 2025

(30) Foreign Application Priority Data

Sep. 12, 2023  (KR) .......................... 10-2023-0120854

(51) Int. Cl.
*H05K 7/20* (2006.01)
(52) U.S. Cl.
CPC ..... *H05K 7/20872* (2013.01); *H05K 7/20272* (2013.01); *H05K 7/2039* (2013.01); *H05K 7/20854* (2013.01)
(58) Field of Classification Search
CPC ........... H05K 7/20772; H05K 7/20272; H05K 7/20781; H05K 7/20836; H05K 7/20872; H05K 7/2039; H05K 7/20854; H05K 7/20254; H05K 7/20809; B60R 16/03; B60R 16/02; B60R 16/0231; B60R 16/033
See application file for complete search history.

(56) References Cited

U.S. PATENT DOCUMENTS

| | | | |
|---|---|---|---|
| 5,323,292 A | 6/1994 | Brzezinski | |
| 9,332,674 B2 * | 5/2016 | Campbell | .......... H05K 7/20236 |
| 10,665,525 B2 | 5/2020 | Teysseyre et al. | |
| 2016/0041562 A1 * | 2/2016 | Mathieu | ................ B60K 35/00 |
| | | | 701/2 |
| 2016/0242313 A1 * | 8/2016 | Singh | ..................... H05K 1/184 |
| 2020/0170144 A1 | 5/2020 | Guo et al. | |

(Continued)

FOREIGN PATENT DOCUMENTS

| | | |
|---|---|---|
| CN | 114423261 A | 4/2022 |
| KR | 10-2013-0013195 A | 2/2013 |

(Continued)

OTHER PUBLICATIONS

Notice to Submit Response for Korean Application No. 10-2023-0120854, dated Feb. 24, 2025.

*Primary Examiner* — Adam B Dravininkas
(74) *Attorney, Agent, or Firm* — Birch, Stewart, Kolasch & Birch, LLP

(57) ABSTRACT

The electronic control unit according to this embodiment comprises at least one control unit. The at least one control unit comprises a first control unit. The first control unit comprises a first coolant jacket in which an inlet and an outlet are formed, a coolant passage through which coolant passes, and a plurality of cooling fins are formed; a first flow valve controlling a coolant passage of the first coolant jacket; a first case disposed above the first coolant jacket; a first control board accommodated in a space formed between the first coolant jacket and the first case; a second case disposed below the first coolant jacket; and a second control board accommodated in a space formed between the first coolant jacket and the second case.

18 Claims, 19 Drawing Sheets

(56) References Cited

U.S. PATENT DOCUMENTS

| | | | |
|---|---|---|---|
| 2021/0242108 A1* | 8/2021 | Jensen | H01L 23/44 |
| 2022/0217869 A1 | 7/2022 | Zhang et al. | |
| 2023/0039781 A1* | 2/2023 | Mohajer | H05K 7/20254 |
| 2024/0237275 A1* | 7/2024 | Karayacoubian | H05K 7/20872 |

FOREIGN PATENT DOCUMENTS

| | | |
|---|---|---|
| KR | 10-2019-0045557 A | 5/2019 |
| KR | 10-2021-0016128 A | 2/2021 |
| WO | WO 2023/046308 A1 | 3/2023 |

* cited by examiner

ELECTRONIC CONTROL UNIT

CROSS-REFERENCE TO RELATED APPLICATIONS

Pursuant to 35 U.S.C. § 119(a), this application claims the benefit of earlier filing date and right of priority to Korean Patent Application No(s). 10-2023-0120854, filed on Sep. 12, 2023, the contents of which are all hereby incorporated by reference herein in their entirety.

BACKGROUND

The present invention relates to an electronic control unit.

Assemblies installed in a vehicle comprise an engine control assembly (or motor control assembly), power transmission assembly, brake assembly, suspension assembly, steering assembly, instrument assembly, and information and communication control assembly.

An electronic control unit (ECU) is a control device that has the function of controlling and managing the main assemblies of a vehicle. A number of electronic control units are installed in the vehicle depending on the assembly to control each assembly.

The electronic control unit may comprise an electronic control unit with a built-in chip for autonomous driving or infotainment (software or media that adds entertainment to the transfer of information) installed in the vehicle, and it is desirable for the chip or the board (control board) on which the chip is installed to be properly cooled to prevent overheating of the chip.

An example of an electronic control unit being cooled is an electronic module disclosed in U.S. Pat. No. 5,323,292 A (Patent, on Jun. 21, 1994). The electronic module comprises an aluminum heat sink surrounding an integrated circuit chip and a substrate, and the aluminum heat sink comprises parallel fins that provide a larger surface area to dissipate heat into the surrounding atmosphere.

SUMMARY

The purpose of this embodiment is to provide an electronic control unit that can cool a plurality of control boards more efficiently.

The purpose of this embodiment is to provide an electronic control unit that can efficiently cool the control boards of each of the plurality of control units even if the number of control units increases.

The electronic control unit according to this embodiment comprises at least one control unit. The at least one control unit comprises a first control unit. The first control unit comprises a first coolant jacket in which an inlet and an outlet are formed, a coolant passage through which coolant passes, and a plurality of cooling fins are formed; a first flow valve controlling the coolant passage of the first coolant jacket; a first case disposed above the first coolant jacket; a first control board accommodated in a space formed between the first coolant jacket and the first case; a second case disposed below the first coolant jacket; and a second control board accommodated in a space formed between the first coolant jacket and the second case.

The first coolant jacket may comprise a first jacket body in which the inlet, the outlet, the coolant passage and the plurality of cooling fins are formed, and a first cover coupled to the jacket body and covering the coolant passage and plurality of cooling fins.

The first control unit may further comprise a thermal pad disposed between an upper surface of the first coolant jacket and a lower surface of the first control board.

The first control unit may further comprise a thermal pad disposed between a lower surface of the first coolant jacket and an upper surface of the second control board.

The first control board may be an autonomous driving board of a vehicle, and the second control board may be an infotainment board of the vehicle.

The first control board and the second control board may be spaced apart vertically, and the first coolant jacket may be interposed between the first control board and the second control board.

The first flow valve may comprise a valve housing; a valve body disposed to be raised or lowered within the valve housing and into the coolant passage of the first coolant jacket; and a driving source configured to raise or lower the valve body.

A through hole through which the valve housing passes may be formed in at least one of the first control board or the second control board.

A valve hole through which the valve body passes may be formed in the first coolant jacket.

The at least one control unit may comprise a second control unit disposed above or below the first control unit.

The second control unit may comprise a second coolant jacket in which an inlet and an outlet are formed, a coolant passage through which coolant passes, and a plurality of cooling fins are formed; a second flow valve controlling the coolant passage of the second coolant jacket; a third control board disposed on the second coolant jacket; and a third case covering the third control board.

The second coolant jacket may comprise a second jacket body in which the inlet and the outlet, the coolant passage and the plurality of cooling fins are formed; and a second cover covering the coolant passage and the plurality of cooling fins.

The second control unit may comprise a thermal pad disposed between the second coolant jacket and the third control board.

The second flow valve may comprise a valve housing; a valve body disposed to be raised or lowered within the valve housing and into the coolant passage of the second coolant jacket; and a driving source configures to raise and lower the valve body.

A through hole through which the valve housing passes may be formed in the third control board.

A valve hole through which the valve body passes may be formed in the second coolant jacket.

The electronic control unit may further comprise an inlet manifold connected to each of the inlet of the first coolant jacket and the inlet of the second coolant jacket; and an outlet manifold connected to each of the outlet of the first coolant jacket and the outlet of the second coolant jacket.

The at least one control unit may comprise a third control unit spaced apart from the second control unit.

The third control unit may comprise a third coolant jacket in which an inlet and an outlet are formed, a coolant passage through which the coolant passes, and a plurality of cooling fins are formed; a third flow valve controlling the coolant passage of the third coolant jacket; a fourth control board disposed on the third coolant jacket; and a fourth case covering the fourth control board.

The third coolant jacket may comprise a third jacket body in which the inlet, the outlet, the coolant passage, and the plurality of cooling fins are formed; and a third cover covering the coolant passage and the plurality of cooling fins.

The third control unit may comprise a thermal pad disposed between the third coolant jacket and the fourth control board.

The third flow valve may comprise a valve housing; a valve body disposed to be raised or lowered within the valve housing and into the coolant passage of the third coolant jacket; and a driving source configured to raise or lower the valve body, A through hole through which the valve housing passes may be formed in the fourth control board.

A valve hole through which the valve body passes may be formed in the third coolant jacket.

The electronic control unit may further comprise an inlet manifold connected to each of the inlet of the first coolant jacket, the inlet of the second coolant jacket, and the inlet of the third coolant jacket; and an outlet manifold connected to each of the outlet of the first coolant jacket, the outlet of the second coolant jacket, and the outlet of the coolant jacket.

The electronic control unit may further comprise a second control unit; and a third control unit spaced apart from the second control unit.

The second control unit may comprise a second coolant jacket disposed above the first control unit and having a coolant passage through which coolant passes, a second flow valve that opens or closes the coolant passage of the second coolant jacket; and a third control board cooled by the second coolant jacket. The third control unit comprises a third coolant jacket disposed below the first control unit and having a coolant passage through which the coolant passes; a third flow valve that opens or closes the coolant passage of the third coolant jacket, and a fourth control board cooled by the third coolant jacket.

DETAILED DESCRIPTION OF THE EMBODIMENTS

Hereinafter, detailed embodiments will be described in detail with reference to the accompanying drawings.

Figure 1:
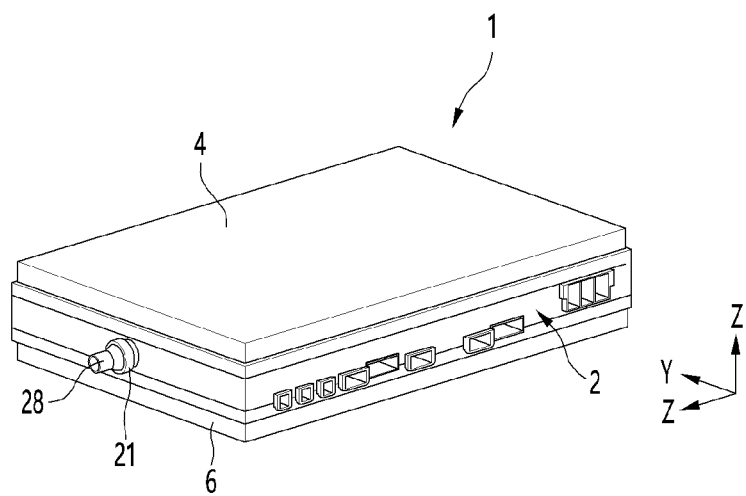
FIG. 1 is a perspective view of an example of an electronic control unit according to this embodiment.
Figure 2:
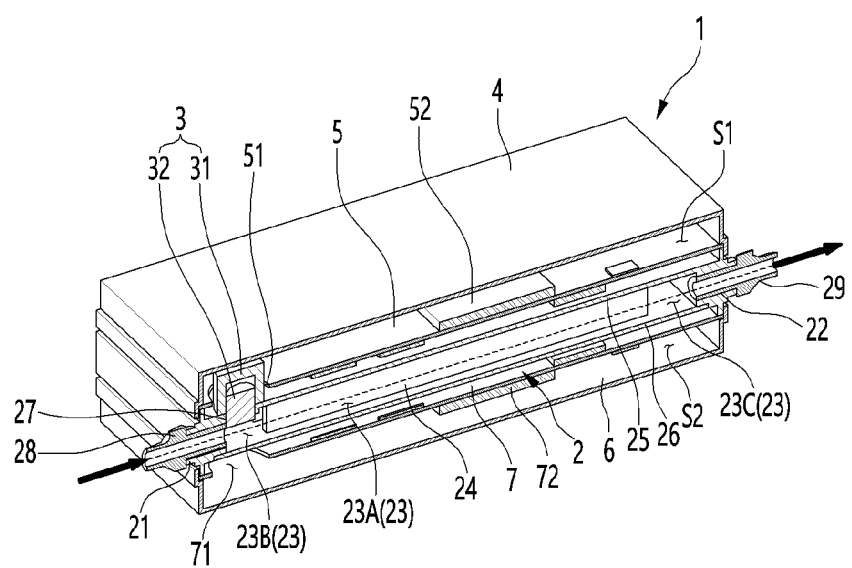
FIG. 2 is a partially cut away perspective view of an example of an electronic control unit according to this embodiment.
Figure 3:
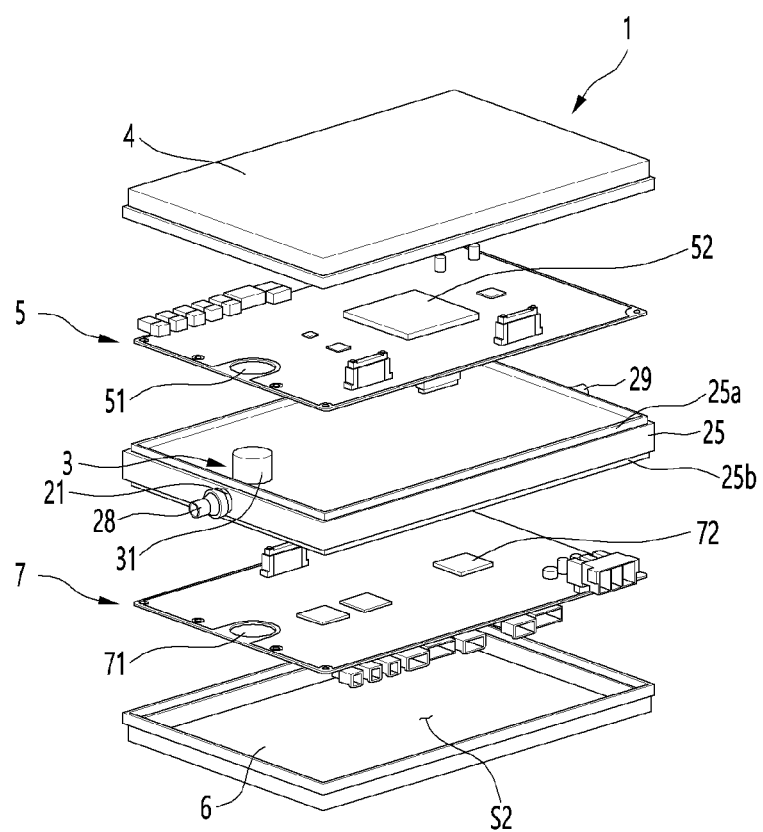
FIG. 3 is an exploded perspective view of an example of the first control unit shown in FIG. 1.
Figure 4:
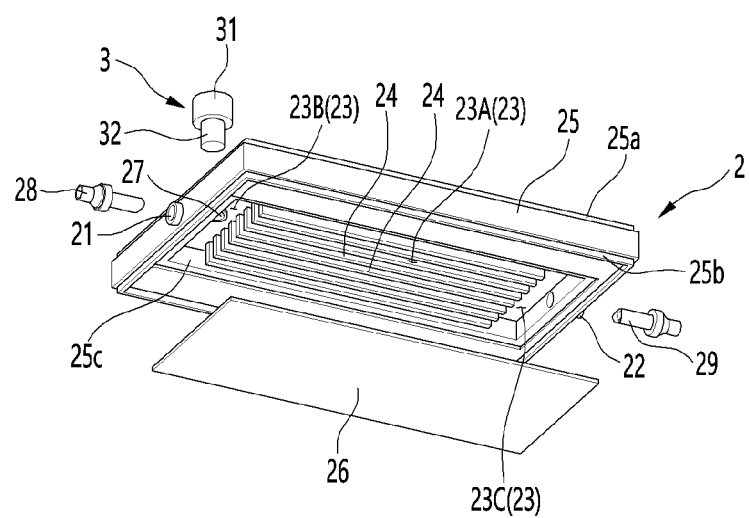
FIG. 4 is an exploded perspective view of the first coolant jacket shown in FIG. 3.

FIG. 1 is a perspective view of an example of an electronic control unit according to this embodiment; FIG. 2 is a partially cut away perspective view of an example of an electronic control unit according to this embodiment; FIG. 3 is an exploded perspective view of an example of the first control unit shown in FIG. 1; and FIG. 4 is an exploded perspective view of the first coolant jacket shown in FIG. 3.

The electronic control unit may comprise at least one control unit. It is possible for the at least one control unit to comprise only one first control unit 1, and it is also possible to further comprise at least one additional control unit in addition to the first control unit 1.

FIGS. 1 to 4 show a case where the electronic control unit comprises only one first control unit 1.

The first control unit 1 comprises a first coolant jacket 2, a first flow valve 3, a first case 4, a first control board 5, a second case 6, and a second control board 7.

An example of the first control unit 1 is an autonomous driving control unit capable of executing partial automation at level 2 of the autonomous driving levels, or an infotainment control unit capable of executing vehicle infotainment (software or media that adds entertainment to the delivery of information) or a dual control unit that can perform autonomous driving and infotainment simultaneously.

The first coolant jacket 2 is a coolant jacket that can cool the first control board 5 and the second control board 7 by water cooling between the first control board 5 and the second control board 7.

An inlet 21 and an outlet 22 may be formed in the first coolant jacket 2, and a coolant flow path 23 through which coolant passes and a plurality of cooling fins 24 may be formed inside the first coolant jacket 2.

The first coolant jacket 2 may have a length in the front-rear direction X, a width in the left-right direction Y, and a thickness in the up-down direction Z.

The first coolant jacket 2 may comprise a jacket body 25 (hereinafter referred to as the first jacket body) and a cover 26 (hereinafter referred to as the first cover).

As shown in FIG. 4, the inlet 21, the outlet 22, the coolant flow path 23, and the cooling fin 24 may be formed in the first jacket body 25.

The inlet 21 may be formed at one end of the first jacket body 25 in the longitudinal direction X of the first jacket body 25, and the outlet 22 may be formed at the other end of the first jacket body 25 in the longitudinal direction X of the first jacket body 25.

The coolant flow path 23 may be formed long inside the first jacket body 25 in the longitudinal direction X of the first jacket body 25.

The coolant passage 23 may comprise a plurality of unit passages 23A, an inlet passage 23B, and an outlet passage 23B.

The plurality of cooling fins 24 are heat transfer fins and may be formed to protrude from the first jacket body 25 or be bent from the first jacket body 25. The cooling fins 24 can be plate-shaped or column-shaped, and are not limited to the shape as long as it can promote heat transfer.

One example of the plurality of cooling fins 24 may be formed long in the longitudinal direction X inside the first jacket body 25. The plurality of cooling fins 24 may divide the coolant passage 23 into a plurality of passages.

The plurality of cooling fins 24 may be provided, and the plurality of cooling fins 24 may be spaced apart from each other in the width direction Y of the first jacket body 25. The coolant passage 23 may be divided into a plurality of unit passages 23A by the plurality of cooling fins 24. a plurality of unit passages 23A may be parallel.

The plurality of cooling fins 24 may be spaced apart from each of the inlet 21 and the outlet 22.

The front end of the cooling fin 24 may be spaced apart from the inlet 21, and the rear end of the cooling fin 24 may be spaced apart from the outlet 22.

The inlet passage 23B may be formed between the inlet 21 and the cooling fin 24, the coolant supplied to the inlet 21 may distributed into a plurality of unit passages.

The outlet passage 23C may be formed between the outlet 22 and the cooling fin 24, the coolant supplied from a plurality of unit passages may be combined in the outlet passage 23C.

An upper rib 25a (refer to FIGS. 3 and 4) for fitting the first case 4 may protrude from the upper surface of the first jacket body 25.

A lower rib 25b (refer to FIGS. 3 and 4) for fitting the second case 6 may protrude from the lower surface of the first jacket body 25.

An opening 25c (refer to FIG. 4) through which the coolant passage 23 and the plurality of cooling fin 24 can be exposed may be formed on the lower surface of the first jacket body 25.

The first cover 26 may cover the coolant passage 23 and the plurality of cooling fins 24. The first cover 26 may be disposed on the first jacket body 25 to cover the opening 25c.

The first cover 26 may be fastened to the first jacket body 25 by a fastening member such as a screw or a hook.

A valve hole 27 through which the valve body 32 of the first flow valve 3 passes may be formed in the first coolant jacket 2.

The valve hole 27 may be formed at a location closer to the inlet 21 of the inlet 21 and the outlet 22.

The valve hole 27 may be opened in a vertical direction toward the inlet passage 23B.

An example of the valve hole 27 may be formed in the upper plate of the first jacket body 25 and face the upper surface of the first cover 26. Another example of the valve hole 27 may be formed in the first cover 26 and face the bottom of the upper plate of the first jacket body 25.

The first coolant jacket 2 may comprise an inlet nipple 28 and an outlet nipple 29.

A portion of the inlet nipple 28 may be inserted into the inlet 21. In this case, the coolant may pass through the inside of the inlet nipple 28 and then flow into the inlet passage 23B.

In case of a portion of the inlet nipple 28 is inserted into the inlet 21, the internal passage formed inside the inlet nipple 28 may communicate with the inlet passage 23B, and the inlet nipple 28 may be the inlet 21.

A portion of the outlet nipple 29 may be inserted into the outlet 22. In this case, the coolant in the outlet passage 23C may flow out through the inside of the outlet nipple 29.

In case of a portion of the outlet nipple 29 is inserted into the outlet 22, the internal passage formed inside the outlet nipple 29 may communicate with the outlet passage 23C, and the outlet nipple 29 may be the outlet 22.

The first coolant jacket 2 may be located between the first control board 5 and the second control board 7 and cools the first control board 5 and the second control board 7 together.

The first flow valve 3 may control the coolant passage 23 of the first coolant jacket 2.

The first flow valve 3 may be disposed in the first coolant jacket 2.

The first flow valve 3 may be disposed closer to the inlet 21 of the inlet 21 and outlet 22 of the first coolant jacket 2, and the opening degree of the outlet of the inlet 21 or the opening degree of the outlet of the inlet nipple 28 may be regulated by the first flow valve 3. That is, the first flow valve 3 may be a flow control valve that regulates the flow rate of coolant.

The first flow valve 3 may be disposed inside the first control unit 1, and the first control unit 1 may be a valve-embedded control unit.

The first flow valve 3 may comprise a valve housing 31 and a valve body 32.

The valve housing 31 may be placed inside the first case 4 or the inside of the second case 6.

A space in which the valve body 32 is accommodated may be formed inside the valve housing 31.

If the valve housing 31 is disposed on the upper portion of the first coolant jacket 2, the valve housing 31 may be accommodated in the space S1 formed inside the first case 4, and the valve housing 31 may penetrate the through hole 51 formed in the first control board 5.

If the valve housing 31 is disposed in the lower portion of the first coolant jacket 2, the valve housing 31 may be accommodated in the space S2 formed inside the second case 6, and the valve housing 31 may penetrate the through hole 71 formed in the second control board 7.

The valve body 32 may be disposed to be raised or lowered inside the valve housing 31 and the coolant passage 23 of the first coolant jacket 2.

If the valve housing 31 is disposed on the upper portion of the first coolant jacket 2, the valve body 32 may be raised and inserted into the space of the valve housing 31, and may be lowered and positioned in the coolant passage 23.

If the valve housing 31 is disposed at the lower portion of the first coolant jacket 2, the valve body 32 can be raised and positioned in the coolant passage 23, and may be lowered and inserted into the space of the valve housing 31.

The first flow valve 3 may further comprise a driving source (not shown). The drive source can raise and lower the valve body 32.

An example of a driving source may comprise a motor having a rotating shaft. Examples of the drive source may further comprise power transmission members such as a worm gear and a worm wheel that convert the rotational motion of the rotation shaft into the reciprocating motion of the valve body 32.

The driving source may adjust the height of the valve body 32 to adjust the opening degree of the coolant passage 23, especially the inlet passage 23b. The driving source can adjust the height of the valve body 32 in multiple stages, and the first flow valve 3 can be an opening control valve or a flow control valve.

The driving source may be connected to either the first control board 5 or the second control board 7 with a wire or the like, and may be controlled by the first control board 5 or the second control board 7.

If the valve housing 31 is disposed on the top of the first coolant jacket 2, the driving source may be electrically connected to the first control board 5 and may be controlled by the first control board 5.

If the valve housing 31 is disposed below the first coolant jacket 2, the drive source may be electrically connected to the second control board 7 and may be controlled by the second control board 7.

The first case 4 may be disposed on the upper side of the first coolant jacket 2. A space (S1, upper space) in which the first control board 5 is accommodated may be formed inside the first case 4.

The first case 4 may be the top case of the first control unit 1. The first case 4 may form the upper appearance of the first control unit 1.

The bottom of the first case 4 may be open.

The edge of the first case 4 may be aligned with the upper rib 25a and may be seated on the upper surface of the first coolant jacket 2.

The first case 4 may be coupled to the first coolant jacket 2 by a fastening member such as a screw or a hook.

The first control board 5 may be accommodated in the space S1 formed between the first coolant jacket 2 and the first case 4.

A through hole (51 or 71) through which the valve housing 31 of the first flow valve 3 penetrates may be formed in at least one of the first control board 5 or the second control board 7.

An upper through hole 51 may be formed in the first control board 5, a lower through hole 71 may be formed in the second control board 7, and the valve housing 31 may penetrate one of an upper through hole 51 and the lower through hole 71.

An example of the first control board 5 may be an autonomous driving board for a vehicle. The first control board 5 may comprise a semiconductor chip 52 such as an MCU that can execute autonomous driving of the vehicle. The first control board 5 may be a level 2 autonomous driving control board capable of executing level 2 partial automation.

The first control board 5 may be equipped with a temperature sensor capable of detecting the temperature of the first control board 5, particularly the temperature of the substrate or the temperature of the semiconductor chip 52, and may be configured to output a control signal to the driving source of the flow valve 3 according to the temperature detected by the temperature sensor. 1

The second case 6 may be disposed below the first coolant jacket 2. A space (S2, lower space) in which the second control board 7 is accommodated may be formed inside the second case 6.

The second case 6 may be the bottom case of the first control unit 1. The second case 6 may form the bottom appearance of the first control unit 1.

The top of the second case 6 may be open.

The edge of the second case 6 may be aligned with the lower rib 25b and may be in contact with the lower surface of the first coolant jacket 2.

The second case 6 may be coupled to the first coolant jacket 2 by a fastening member such as a screw or a hook.

The second control board 7 may be accommodated in the space S2 formed between the first coolant jacket 2 and the second case 6.

The second control board 7 may be vertically spaced apart from the first control board 5 with the first coolant jacket 2 therebetween.

An example of the second control board 7 may be an infotainment board of a vehicle. The second control board 7 may comprise a semiconductor chip 72 such as an MCU that controls media such as audio and video installed in the vehicle.

The second control board 7 may be equipped with a temperature sensor capable of detecting the temperature of the second control board 7, in particular, the temperature of the substrate or the temperature of the semiconductor chip 72, and may be configured to output a control signal to the driving source of the flow valve 3 according to the temperature detected by the temperature sensor.

The first control unit 1 may further comprise a thermal pad (not shown, hereinafter referred to as a first thermal pad) disposed between the upper surface of the first coolant jacket 2 and the lower surface of the first control board 5.

The lower surface of the first control board 5 or the semiconductor chip 52 provided on the first control board 5 may be in direct contact with the upper surface of the first coolant jacket 2, and the first thermal pad may be used to make thermal contact with the upper surface of the coolant jacket 2.

The first control unit 1 may further comprise a thermal pad (not shown, referred to as a second thermal pad) disposed between the lower surface of the first coolant jacket 2 and the upper surface of the second control board 7.

The upper surface of the second control board 7 or the semiconductor chip 72 provided on the second control board 7 may be in direct contact with the lower surface of the first coolant jacket 2, and the second thermal pad may be used to make thermal contact with the lower surface of the coolant jacket 2.

Figure 5:
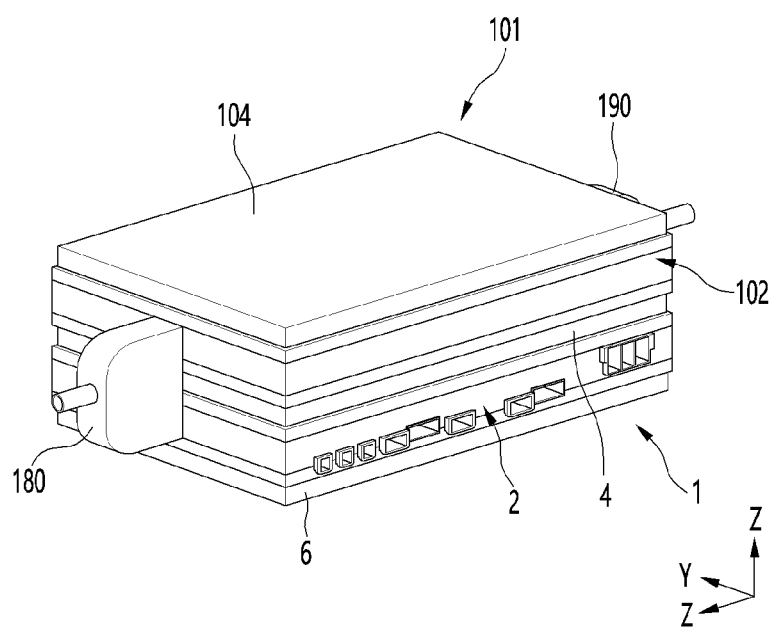
FIG. 5 is a perspective view of another example of an electronic control unit according to this embodiment.
Figure 6:
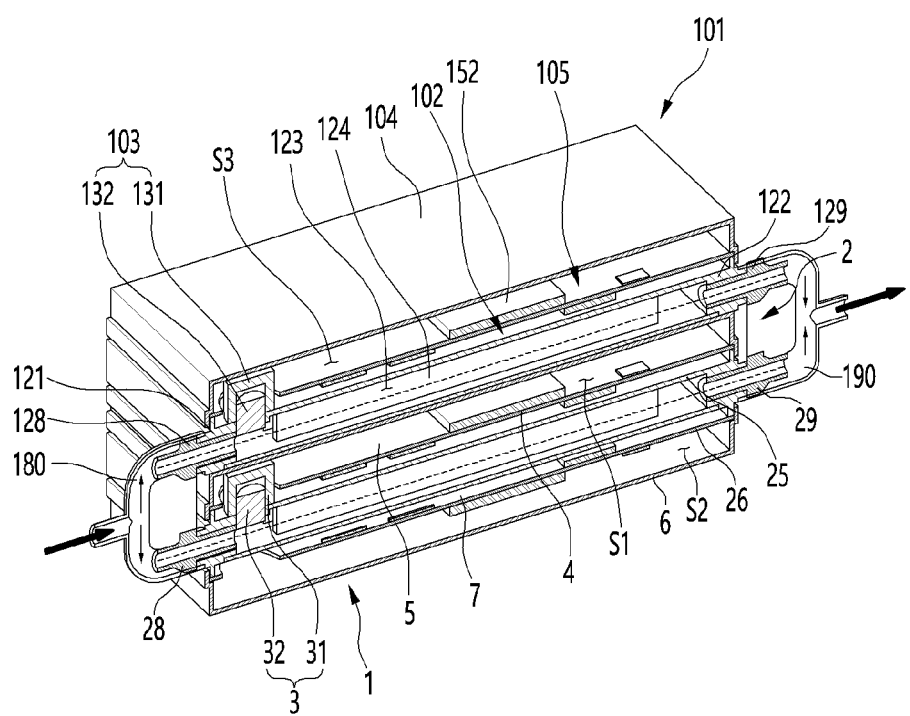
FIG. 6 is a partially cut away perspective view of another example of an electronic control unit according to this embodiment.
Figure 7:
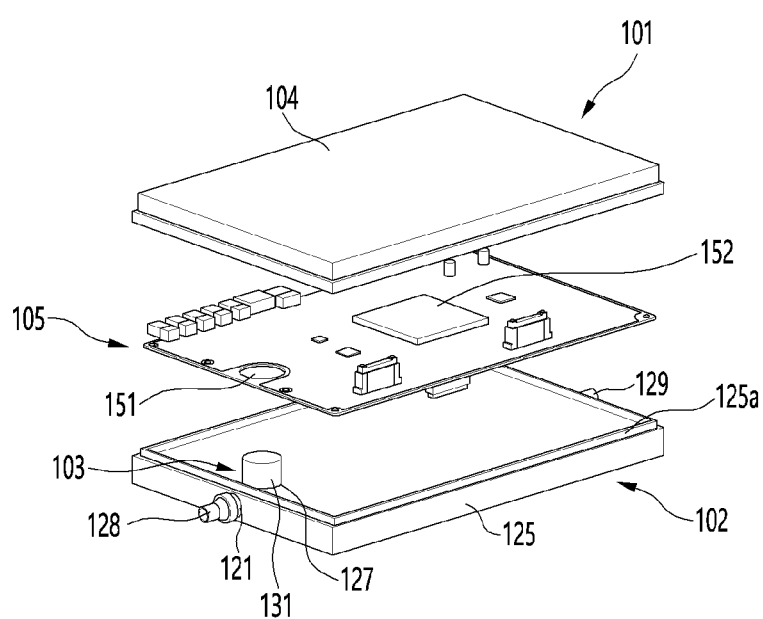
FIG. 7 is an exploded perspective view of an example of the second control unit shown in FIG. 5.
Figure 8:
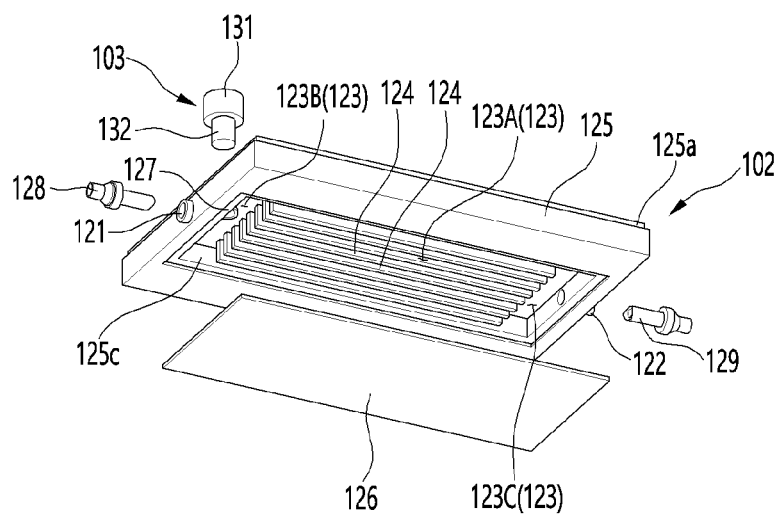
FIG. 8 is an exploded perspective view of the second coolant jacket shown in FIG. 7.

FIG. 5 is a perspective view of another example of an electronic control unit according to this embodiment; FIG. 6 is a partially cut away perspective view of another example of an electronic control unit according to this embodiment; FIG. 7 is an exploded perspective view of an example of the second control unit shown in FIG. 5; and FIG. 8 is an exploded perspective view of the second coolant jacket shown in FIG. 7.

Another example of the electronic control unit according to this embodiment is that at least one control unit may be provided in plurality, and the plurality of control units may comprise the first control unit 1 and a second control unit 101 is disposed above the upper side or below side of the first control unit 1.

The first control unit 1 may be a base module or a module that is basically mounted on a vehicle.

The second control unit 101 may be an expanded module that extends to the base module, and may be additionally installed depending on the vehicle specifications.

The first control unit 1 and the second control unit 101 can be stacked in the up-down direction Z.

The first control unit 1 may be the same as the first control unit 1 of an example of an electronic control unit according to this embodiment, and hereinafter, to avoid duplicate description, the same symbols are used and description thereof is omitted.

The second control unit 101 may be an upper control unit disposed above the first control unit 1 or a lower control unit disposed below the first control unit 1.

The second control unit 101 may comprise a second coolant jacket 102, a second flow valve 103, a third case 104, and a third control board 105.

An example of the second control unit 101 may be an autonomous driving control unit capable of executing conditional autonomous driving, which is level 3 of the autonomous driving levels.

The second coolant jacket 102 may be a coolant jacket that can cool the third control board 105 by water cooling from the upper or lower side of the third control board 105.

The second coolant jacket 102 may be disposed above the first control unit 1 and below the third control board 105, may be disposed between the first control unit 1 and the third control board 105, and may dissipate both the heat of the first control board 5 and the heat of the third control board 105.

The second coolant jacket 102 may be disposed below the first control unit 1 and above the third control board 105, may be disposed between the first control unit 1 and the third control board 105, and may dissipate both the heat of the second control board 7 and the heat of the third control board 105.

An inlet 121 and an outlet 122 are formed in the second coolant jacket 102, and a coolant passage 123 through which coolant passes and a plurality of cooling fins 124 located in the coolant passage 123 are formed inside the second coolant jacket 102.

The second coolant jacket 102 may be parallel to the first coolant jacket 2 of the first control unit 1, and comprises the inlet 121, the outlet 122, the coolant passage 123, and the plurality of cooling fins 124 may be the same as the inlet 21, the outlet 22, the coolant passage 23, and the plurality of cooling fin 24 of the first coolant jacket 2, and detailed description is omitted to avoid redundant description.

The second coolant jacket 102 may be spaced apart from the first coolant jacket 2 in the vertical direction Z.

Like the first coolant jacket 2, the second coolant jacket 102 may comprise a jacket body 125 (hereinafter referred to as second jacket body) and a cover 126 (hereinafter referred to as second cover).

As shown in FIG. 8, the inlet 121, the outlet 122, the coolant passage 123, and a plurality of cooling fins 124 may be formed in the second jacket body 125.

The coolant passage 123 may comprise a plurality of unit passages 123A, an inlet passage 123B, and an outlet passage 123B, like the coolant passage 23 of the first coolant jacket 2.

The plurality of cooling fins 124 may be provided, and the plurality of cooling fins 124 may be spaced apart from each other in the width direction Y of the second jacket body 125. The passage 123 may be divided into a plurality of unit passages 123A by the plurality of cooling fins 124. The plurality of unit passages 123A may be parallel.

The inlet passage 123B may be formed between the inlet 121 and the plurality of cooling fins 124 through which the coolant supplied to the inlet 121 is distributed into a plurality of unit passages 123A.

The outlet passage 123C may be formed between the outlet 122 and the plurality of cooling fins 124 and the coolant supplied from a plurality of unit passages 123A may be combined in the outlet passage 123C.

An upper rib 125a (refer to FIGS. 7 and 8) for fitting the third case 104 may protrude from the upper surface of the second jacket body 125.

An opening 125c (refer to FIG. 8) through which the coolant passage 123 and the cooling fin 124 can be exposed may be formed on the lower surface of the second jacket body 125.

The second cover 126 may cover the coolant passage 123 and the plurality of cooling fins 124. The second cover 126 may be disposed on the second jacket body 125 to cover the opening 125c.

The second cover 126 may be fastened to the second jacket body 125 by a fastening member such as a screw or a hook.

A valve hole 127 through which the valve body 132 of the second flow valve 103 passes may be formed in the second coolant jacket 102.

The valve hole 127 may be formed at a location closer to the inlet 121 of the inlet 121 and the outlet 122.

The valve hole 127 may be open in a vertical direction toward the inlet passage 123B.

An example of the valve hole 127 may be formed on the upper plate of the second jacket body 125 and face the upper surface of the second cover 126. Another example of the valve hole 127 may be formed in the first cover 126 and face the bottom of the upper plate of the second jacket body 125.

The second coolant jacket 102 may comprise an inlet nipple 128 and an outlet nipple 129.

A portion of the inlet nipple 128 may be inserted into the inlet 121. In this case, the coolant may pass through the inside of the inlet nipple 128 and then flow into the inlet passage 123B.

If a portion of the inlet nipple 128 is inserted into the inlet 121, the internal passage formed inside the inlet nipple 128 may communicate with the inlet passage 123B, and the inlet nipple 128 may be the inlet 121.

A portion of the outlet nipple 129 may be inserted into the outlet 122. In this case, the coolant in the outlet passage 123C may flow out through the inside of the outlet nipple 129.

If a portion of the outlet nipple 129 is inserted into the outlet 122, the internal passage formed inside the outlet nipple 129 may communicate with the outlet passage 123C, and the outlet nipple 129 may be the outlet 122.

The second flow valve 103 may control the coolant passage 123 of the second coolant jacket 102.

The second flow valve 103 may comprise a valve housing 131 and a valve body 132.

The valve housing 131 may be disposed inside the third case 104.

A space in which the valve body 132 is accommodated may be formed inside the valve housing 131.

The valve housing 131 may be accommodated in the space S3 formed inside the third case 104 and may penetrate a through hole 151 formed in the third control board 105.

The valve body 132 may be disposed to be raised or lowered inside the valve housing 131 and the coolant passage 123 of the second coolant jacket 102.

If the valve housing 131 is disposed on the upper portion of the second coolant jacket 102, the valve body 132 may be raised and inserted into the space of the valve housing 131, and may be lowered and positioned in the coolant passage 123.

If the valve housing 131 is disposed below the second coolant jacket 102, the valve body 132 may be raised and positioned in the coolant passage 123, and may be lowered and inserted into the space of the valve housing 131.

The second flow valve 103 may further comprise a driving source (not shown). The driving source may raise and lower the valve body 132.

An example of a driving source may comprise a motor having a rotating shaft. Examples of the driving source may further comprise power transmission members such as a worm gear and a worm wheel that convert the rotational motion of the rotating shaft into the reciprocating motion of the valve body 132.

The driving source may adjust the height of the valve body 132 to adjust the opening degree of the coolant passage 123, especially the inlet passage 123b. The driving source may adjust the height of the valve body 132 in multiple stages, and the second flow valve 103 may be an opening control valve or a flow control valve.

The driving source may be connected to the third control board 105 with a wire or the like and may be controlled by the third control board 105.

The third case 104 may cover the third control board 105. The third case 104 may be disposed on the upper side of the second coolant jacket 102.

The third case 104 may be disposed on the upper or lower side of the second coolant jacket 102. A space S3 in which the third control board 105 is accommodated may be formed inside the third case 103.

If the third case 104 is disposed above the second coolant jacket 102, the third case 104 may be a top case of the electronic control unit. The third case 104 may form the top exterior of the electronic control unit. The bottom of the third case 104 may be open. The edge of the third case 104 may be aligned with the upper rib 125a of the second coolant jacket 102 and may be seated on the upper surface of the second coolant jacket 102.

If the third case 104 is disposed below the second coolant jacket 102, the third case 104 may be a bottom case of the electronic control unit. The third case 104 may form the bottom appearance of the electronic control unit. The upper surface of the third case 104 may be open. The edge of the third case 104 may be aligned with the lower rib (not shown) of the second coolant jacket 102 and may be in contact with the lower surface of the second coolant jacket 102.

The third case 104 may be coupled to the second coolant jacket 102 by a fastening member such as a screw or a hook.

The third control board 105 may be disposed in the second coolant jacket 1. The third control board 105 may be disposed on the upper or lower surface of the second coolant jacket 1.

The third control board 105 may be accommodated in the space S3 formed between the second coolant jacket 102 and the third case 104.

A through hole 151 through which the valve housing 131 of the second flow valve 103 penetrates may be formed in the third control board 105.

An example of the third control board 105 may be an autonomous driving board for a vehicle. The third control board 105 may comprise a semiconductor chip 152 such as an MCU that can execute autonomous driving of the vehicle. The third control board 105 may be a level 3 autonomous driving control board capable of executing level 3 conditional automation.

The third control board 105 may communicate with the first control board 5, and during level 3 autonomous driving, the semiconductor chip 52 of the first control board 5 and the semiconductor chip 152 of the third control board 105 may also perform calculations for level 3 autonomous driving.

A temperature sensor capable of detecting the temperature of the third control board 105, particularly the temperature of the substrate or the temperature of the semiconductor chip 152, may be disposed on the third control board 105, the temperature sensor may output a control signal to the driving source of the flow valve 103 according to the temperature of the substrate or the temperature of the semiconductor chip 152.

During level 3 autonomous driving, the first control board 5 may output a control signal to the driving source of the first flow valve 3 according to the temperature detected by the temperature sensor installed on the first control board 5, and the third control board 105 may output a control signal to the driving source of the second flow valve 103 according to the temperature detected by the temperature sensor installed on the control board 105.

The second control unit 101 may further comprise a thermal pad (hereinafter referred to as a third thermal pad) disposed between the second coolant jacket 102 and the third control board 105.

The coolant flowing through the second coolant jacket 102 may dissipate the heat of the first control board 5 of the first control unit 1 and the heat of the control board 105 of the second control unit 101 together, the second control unit 101 may be preferably disposed above the first control unit 1.

As shown in FIG. 6, the second coolant jacket 102 of the second control unit 101 may be disposed on the upper side of the first case 4, and the third control board 105 may be preferably in direct contact with the upper surface of the second coolant jacket 102 or in thermal contact through a third thermal pad with the second coolant jacket 102 and the third case 104 is preferably disposed on the upper side of the second coolant jacket 102.

Another example of the electronic control unit according to this embodiment may further comprise an inlet manifold 180 and an outlet manifold 190.

The inlet manifold 180 may be connected to each of the inlet 21 of the first coolant jacket 2 and the inlet 121 of the second coolant jacket 102.

When a portion of the inlet nipple 28 is inserted into the inlet 21 of the first coolant jacket 2 and a portion of the inlet nipple 128 is inserted into the inlet 121 of the second coolant jacket 102, the inlet manifold 180 may be connected to the inlet nipple 28 of the first coolant jacket 2 and the inlet nipple 128 of the second coolant jacket 102.

The outlet manifold 190 may be connected to each of the outlets 22 of the first coolant jacket 2 and the outlets 122 of the second coolant jacket 102.

When a portion of the outlet nipple 29 is inserted into the outlet 22 of the first coolant jacket 2 and a portion of the outlet nipple 129 is inserted into the outlet 122 of the second coolant jacket 102, the outlet manifold 190 may be connected to each of the outlet nipple 29 of the first coolant jacket 2 and the outlet nipple 129 of the second coolant jacket 102.

Figure 9:
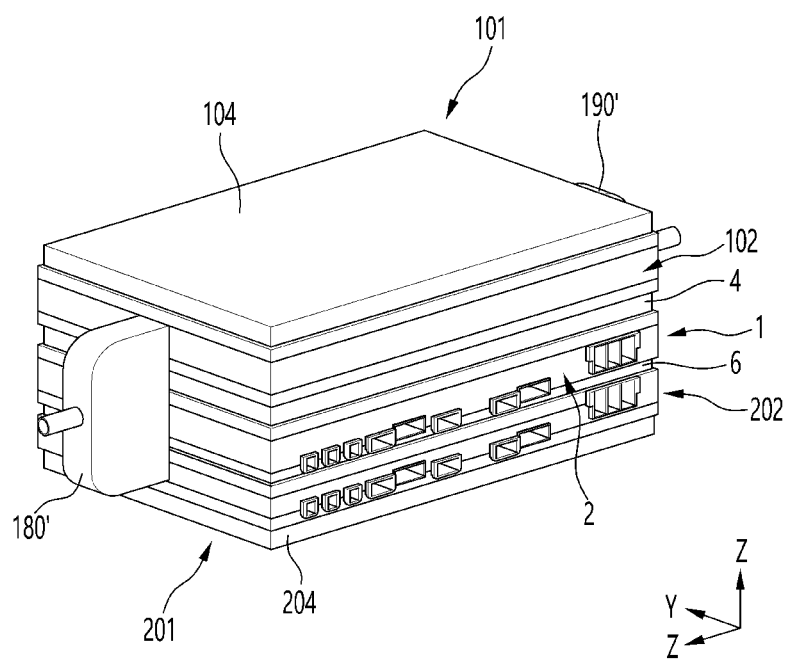
FIG. 9 is a perspective view of the other example of an electronic control unit according to this embodiment.
Figure 10:
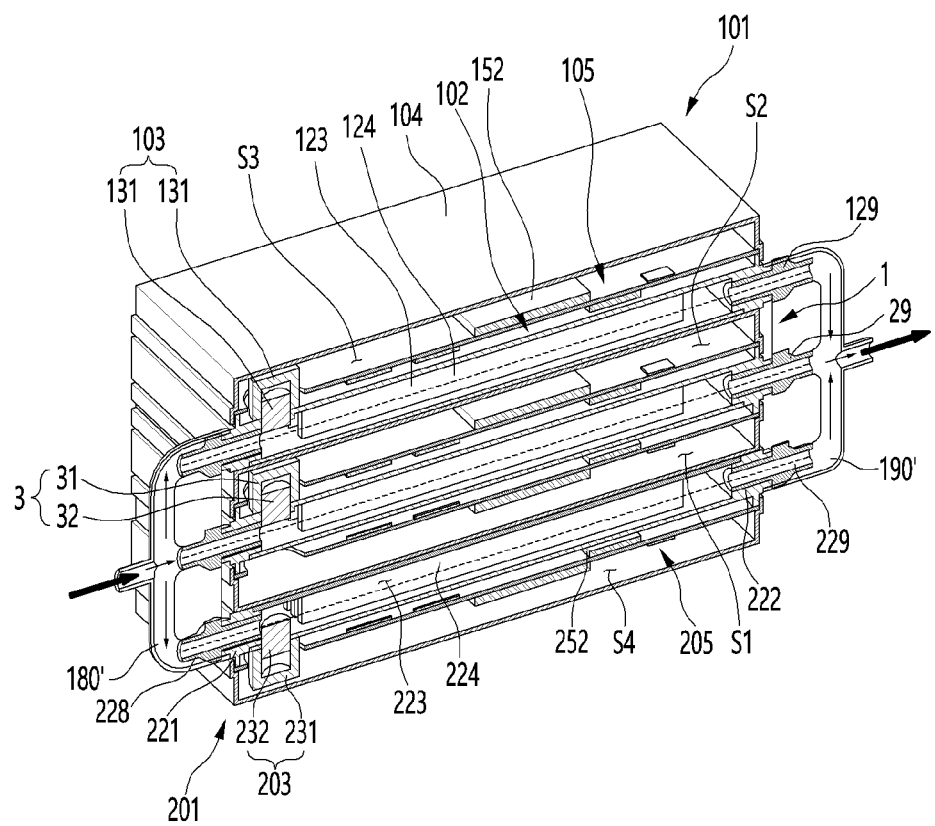
FIG. 10 is a partially cut away perspective view of the other example of an electronic control unit according to this embodiment.
Figure 11:
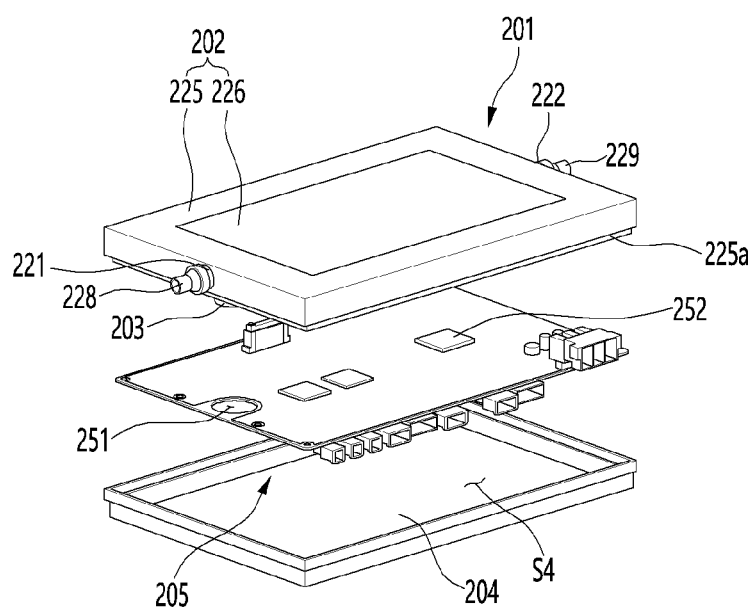
FIG. 11 is an exploded perspective view of an example of the third control unit shown in FIG. 9.
Figure 12:
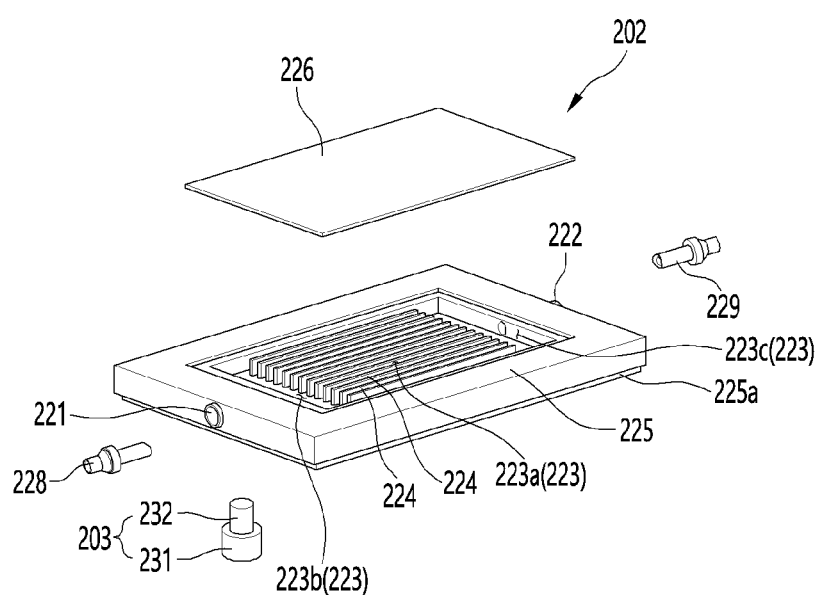
FIG. 12 is an exploded perspective view of the third coolant jacket shown in FIG. 11.

FIG. 9 is a perspective view of the other example of an electronic control unit according to this embodiment; FIG. 10 is a partially cut away perspective view of the other example of an electronic control unit according to this embodiment; FIG. 11 is an exploded perspective view of an example of the third control unit shown in FIG. 9; and FIG. 12 is an exploded perspective view of the third coolant jacket shown in FIG. 11.

The other example of the electronic control unit according to this embodiment is that at least one control unit may be provided in plurality, and the plurality of control units may comprise the first control unit 1, the second control units 101 disposed above the first control unit 1 and a third control unit 201 disposed below the first control unit 1.

The first control unit 1 may be a base module or a module that is basically mounted on the vehicle.

The second control unit 101 and the third control unit 201 may be expanded modules that extend to the base module, and may be additionally installed according to the specifications of the vehicle.

The first control unit 1, the second control unit 101, and the third control unit 201 may be stacked in the up-down direction Z.

The first control unit 1 may be disposed between the second control unit 101 and the third control unit 201.

The first control unit 1 may be the same as the first control unit 1 of an example of an electronic control unit according to this embodiment, and hereinafter, to avoid duplicate description, the same symbols are used and description thereof is omitted.

The second control unit 101 may be the same as the second control unit 101 of another example of the electronic control unit according to this embodiment, and hereinafter, to avoid duplicate description, the same symbols are used and description thereof is omitted.

Each of the second control unit 101 and the third control unit 201 comprises a coolant jacket having a coolant passage through which coolant passes and a flow valve that opens and closes the coolant passage.

The third control unit 201 may be spaced apart from the second control unit 101 in the vertical direction.

The third control unit 201 may be a lower control unit disposed below the first control unit 1.

The third control unit 201 may comprise a third coolant jacket 202, a third flow valve 203, a fourth case 204, and a fourth control board 205.

An example of the third control unit 201 may be an autonomous driving control unit capable of executing high autonomous driving, which is level 4 of the autonomous driving levels.

The third coolant jacket 202 may be a coolant jacket that can cool the fourth control board 205 by water cooling on the upper side of the fourth control board 205.

The third coolant jacket 202 may be disposed below the first control unit 1 and above the fourth control board 205, and may be disposed between the first control unit 1 and the fourth control board. The third coolant jacket 202 may dissipate the heat of the second control board 7 and the heat of the fourth control board 205 together.

An inlet 221 and an outlet 222 are formed in the third coolant jacket 202, and a coolant passage 223 through which coolant passes and a plurality of cooling fins 224 are formed inside the third coolant jacket 202.

The third coolant jacket 202 may be parallel to the first coolant jacket 2 of the first control unit 1, and comprises the inlet 221, the outlet 222, the coolant passage 223, and the plurality of cooling fins 224 may be the same as the inlet 21, the outlet 22, the coolant passage 23, and the plurality of cooling fins 24 of the first coolant jacket 2, and detailed description is omitted to avoid redundant description.

The third coolant jacket 202 may be spaced apart from the first coolant jacket 2 in the vertical direction Z.

Like the first coolant jacket 2, the third coolant jacket 202 may comprise a jacket body 225 (hereinafter referred to as the third jacket body) and a cover 226 (hereinafter referred to as the third cover).

As shown in FIG. 12, the inlet 221, the outlet 222, the coolant passage 223, and the plurality of cooling fins 224 may be formed in the third jacket body 225.

The coolant passage 223 may comprise a plurality of unit passages 223A, an inlet passage 223B, and an outlet passage 223B, like the coolant passage 23 of the first coolant jacket 2.

A plurality of cooling fins 224 may be provided, and the plurality of cooling fins 224 may be spaced apart from each other in the width direction Y of the third jacket body 225. The coolant passage 223 may be divided into a plurality of unit passages 223 by the plurality of cooling fins 224. The plurality of unit passages 223A may be parallel.

An inlet passage 223B may be formed between the inlet 221 and the plurality of cooling fins 224, through which the coolant supplied to the inlet 221 is distributed into a plurality of unit passages 223A.

An outlet passage 223C may be formed between the outlet 222 and the plurality of cooling fins 224, in which the coolant flowing in the plurality of unit passages 223A is combined.

A lower rib 225*a* (refer to FIGS. 11 and 12) for fitting the fourth case 204 may protrude from the lower surface of the third jacket body 225.

An opening 225*c* (refer to FIG. 12) through which the coolant passage 223 and the plurality of cooling fins 224 can be exposed may be formed on the upper surface of the third jacket body 225.

The third cover 226 may cover the coolant passage 223 and the plurality of cooling fins 224. The third cover 226 may be disposed on the third jacket body 225 to cover the opening 225*c*.

The third cover 226 may be fastened to the third jacket body 225 by a fastening member such as a screw or a hook.

A valve hole 227 through which the valve body 232 of the third flow valve 203 passes may be formed in the third coolant jacket 202.

The valve hole 227 may be formed at a location closer to the inlet 221 of the inlet 221 and the outlet 222.

The valve hole 227 may be open in a vertical direction toward the inlet passage 223B.

An example of the valve hole 227 may be formed on the lower plate of the third jacket body 225 and face the second cover 226. Another example of the valve hole 227 may be formed in the first cover 226 and face the bottom of the lower plate of the third jacket body 225.

The third coolant jacket 202 may comprise an inlet nipple 228 and an outlet nipple 229.

A portion of the inlet nipple 228 may be inserted into the inlet 221. In this case, the coolant may pass through the inside of the inlet nipple 228 and then flow into the inlet passage 223B.

If a portion of the inlet nipple 228 is inserted into the inlet 221, the internal passage formed inside the inlet nipple 228 may communicate with the inlet passage 223B, and the inlet nipple 228 may be the inlet 221.

A portion of the outlet nipple 229 may be inserted into the outlet 222. In this case, the coolant in the outlet passage 223C may flow out through the inside of the outlet nipple 229.

If a portion of the outlet nipple 229 is inserted into the outlet 222, the internal passage formed inside the outlet nipple 229 may communicate with the outlet passage 223C, and the outlet nipple 229 may be the outlet 222.

The third flow valve 203 can control the coolant passage 223 of the third coolant jacket 202.

The third flow valve 203 may comprise a valve housing 231 and a valve body 232.

The valve housing 231 may be disposed inside the fourth case 204.

A space in which the valve body 232 is accommodated may be formed inside the valve housing 231.

The valve housing 231 may be accommodated in the space S4 formed inside the fourth case 204 and may penetrate the through hole 251 formed in the fourth control board 205.

The valve body 232 may be disposed to be raised or lowered inside the valve housing 231 and the coolant passage 223 of the third coolant jacket 202.

If the valve housing 231 is disposed at the lower portion of the third coolant jacket 202, the valve body 232 may be raised and positioned in the coolant passage 223, and may be lowered and inserted into the space of the valve housing 231.

The third flow valve 203 may further comprise a driving source (not shown). The drive source can raise or lower the valve body 232.

An example of a driving source may comprise a motor having a rotating shaft. Examples of the drive source may further comprise power transmission members such as a worm gear and a worm wheel that convert the rotational motion of the rotation shaft into the reciprocating motion of the valve body 232.

The driving source may adjust the height of the valve body 232 to adjust the opening degree of the coolant passage 223, especially the inlet passage 223b. The driving source may adjust the height of the valve body 232 in multiple stages, and the third flow valve 203 may be an opening control valve or a flow control valve.

The driving source may be connected to the fourth control board 205 with a wire or the like and may be controlled by the fourth control board 205.

The fourth case 204 may cover the fourth control board 205. The fourth case 204 may be disposed below the third coolant jacket 202.

A space S4 in which the fourth control board 205 is accommodated may be formed inside the fourth case 204.

When the fourth case 204 is disposed below the third coolant jacket 202, the fourth case 204 may be a bottom case of the electronic control unit. The fourth case 204 may form the bottom exterior of the electronic control unit. The upper surface of the fourth case 204 may be open. The edge of the fourth case 204 may be aligned with the lower rib 225a of the third coolant jacket 202 and may be in contact with the lower surface of the third coolant jacket 202.

The fourth case 204 may be coupled to the third coolant jacket 202 by a fastening member such as a screw or a hook.

The fourth control board 205 may be disposed below the third coolant jacket 202. The fourth control board 201 may be disposed on the lower surface of the third coolant jacket 202.

The fourth control board 205 may be accommodated in the space S4 formed between the third coolant jacket 202 and the fourth case 204.

A through hole 251 through which the valve housing 231 of the third flow valve 203 penetrates may be formed in the fourth control board 205.

An example of the fourth control board 205 may be an autonomous driving board for a vehicle. The fourth control board 205 may comprise a semiconductor chip 252 such as an MCU that can execute autonomous driving of the vehicle. The fourth control board 205 may be a level 4 autonomous driving control board capable of executing level 4 autonomous driving.

The fourth control board 205 can communicate with at least one of the first control board 5 or the second control board 105, and during level 4 autonomous driving, the semiconductor chip 252 of the third control board 205 may perform calculations for level 4 autonomous driving together with at least one of the semiconductor chip 52 of the first control board 5 or the semiconductor chips 152 of the second control board 105.

A temperature sensor capable of detecting the temperature of the fourth control board 205, particularly the temperature of the substrate or the temperature of the semiconductor chip 252, may be disposed on the fourth control board 205, and the temperature sensor may output a control signal to the driving source of the flow valve 203 according to the temperature detected by the temperature sensor.

During level 4 autonomous driving, the first control board 5 may output a control signal to the driving source of the first flow valve 3 according to the temperature detected by the temperature sensor installed on the first control board 5, the third control board 105 may output a control signal to the driving source of the second flow valve 1033 according to the temperature detected by the temperature sensor installed on the third control board 105 and the fourth control board 205 may output a control signal to the driving source of the third flow valve 203 according to the temperature detected by the temperature sensor installed on the fourth control board 205.

The third control unit 201 may further comprise a thermal pad (hereinafter referred to as a fourth thermal pad) disposed between the third coolant jacket 202 and the fourth control board 205.

The coolant flowing through the third coolant jacket 202 may be preferably to cool the second control board 7 of the first control unit 1, the fourth control board 205 of the third control unit 201 together, the third control unit 201 is preferably disposed below the first control unit 1.

The other example of the electronic control unit according to this embodiment may further comprise an inlet manifold (180') and an outlet manifold (190').

The inlet manifold 180' is connected to each of the inlet 21 of the first coolant jacket 2, the inlet 121 of the second coolant jacket 102, and the inlet 221 of the third coolant jacket 202.

In case of a portion of the inlet nipple 28 is inserted into the inlet 21 of the first coolant jacket 2, a portion of the inlet nipple 128 is inserted into the inlet 121 of the second coolant jacket 102, and a portion of the inlet nipple 128 is inserted into the inlet 121 of the second coolant jacket 102, the inlet manifold 180' is connected to the inlet nipple 28 of the first coolant jacket 2, the inlet nipple 128 the second coolant jacket 102 and the inlet nipple 228 of the third coolant jacket 202, respectively.

The outlet manifold 190' is connected to each of the outlets 22 of the first coolant jacket 2, the outlets 122 of the second coolant jacket 102, and the outlets 222 of the third coolant jacket 202.

In case of a portion of the outlet nipple 29 is inserted into the outlet 22 of the first coolant jacket 2, a portion of the outlet nipple 129 is inserted into the outlet 122 of the second coolant jacket 102, and a portion of the outlet nipple 229 is inserted into the outlet 222 of the third coolant jacket 102, the outlet manifold 190' is connected to the outlet nipple 29 of the first coolant jacket 2, the outlet nipple 129 of the second coolant jacket 102 and the outlet nipple 229 of the third coolant jacket 202, respectively.

In this embodiment, a coolant passage through which coolant can flow is formed in each of the plurality of control units 1, 101 and 201, the plurality of cooling fins are installed parallel to the direction of coolant flowing to promote conductive heat transfer in the coolant passage, and the coolant performs a cooling function targeting the first control board 5, second control board 7, third control board 105, and fourth control board 205 after the coolant flow into each coolant passage.

The coolant may be combined and may flow out of the electronic control unit after performing the cooling function.

The flow valve mounted on the inlet passage of each of the plurality of control units 1, 101 and 201 may receive signal from the MCU mounted on the control board of each of the plurality of control units 1, 101 and 201 and may be actively controlled to prevent the temperature of the high-heating element from exceeding the allowable temperature.

The operation rate of the plurality of control units 1, 101 and 201 may be different depending on the type of function performed, and if there is a dethroughtion in the amount of heat generated for each control unit, the flow rate may be reduced to the low heat generation control unit through control of the flow valve and the flow rate may be increased in the high heat control unit, and a more efficient cooling function may be performed.

Figure 13:
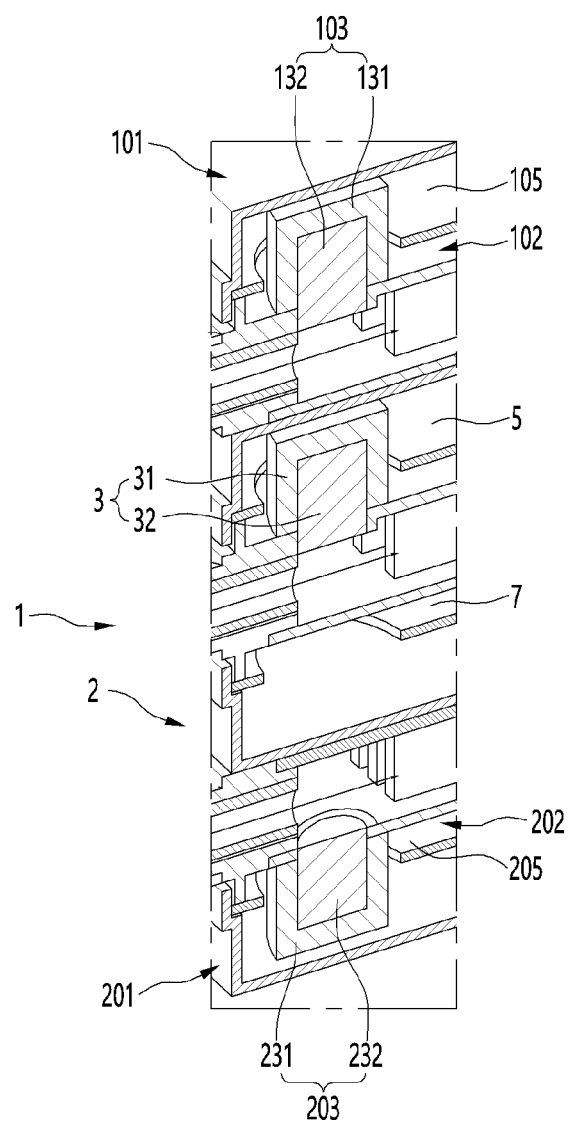
FIG. 13 is an enlarged view when all flow valves shown in FIG. 10 are open.

FIG. 13 is an enlarged view when all flow valves shown in FIG. 10 are open.

Each of the first control board 5, the third control board 105, and the fourth control board 205 may control each of the driving source of the first flow valve 3, the driving source of the second flow valve 103 and the driving source of the third flow valve 3 according to the temperature detected by the temperature sensor provided in each of first control board 5, the third control board 105, and the fourth control board 20.

If the temperatures detected by the temperature sensors provided in each of the first control board 5, the third control board 105, and the fourth control board 205 are all above the cooling set temperature, the first control board 5 may control the driving source of the first flow valve 3 in open mode, the third control board 105 may control the driving source of the second flow valve 103 in an open mode, and the fourth control board 205 can control the driving source of the third flow valve 203 in open mode.

As shown in FIG. 13, the coolant may be dispersed and flow in all of the first, second, and third coolant jackets 2, 102 and 202, the first control board 5, and the second control board 7, the third control board 105 and the fourth control board 205 may be cooled together.

Figure 14:
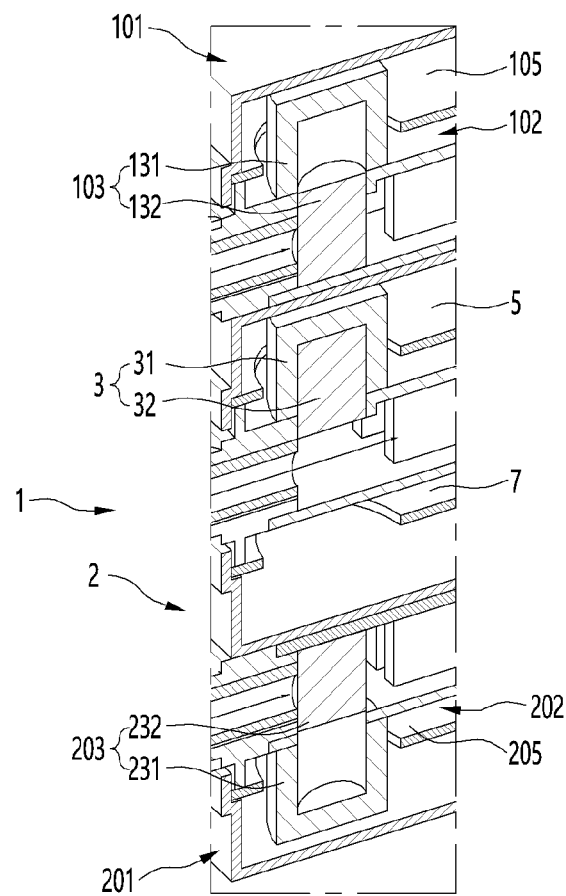
FIG. 14 is an enlarged view when the first control unit shown in FIG. 10 generates heat.

FIG. 14 is an enlarged view when the first control unit shown in FIG. 10 generates heat.

The temperature detected by the temperature sensor provided in the first control board 5 is above the cooling set temperature, and the temperature detected by the temperature sensors provided in each of the third control board 105 and the fourth control board 205 is below the cooling set temperature, the first control board 5 may control the driving source of the first flow valve 3 in an open mode, the third control board 105 may control the driving source of the second flow valve 103 in a closed mode, and the fourth control board 205 may control the driving source of the third flow valve 203 in a closed mode.

As shown in FIG. 14, coolant is supplied only to the first coolant jacket 2, and is not supplied to the second coolant jacket 102 and the third coolant jacket 202, and the first control board 5 and the second control board 7 can be cooled.

Figure 15:
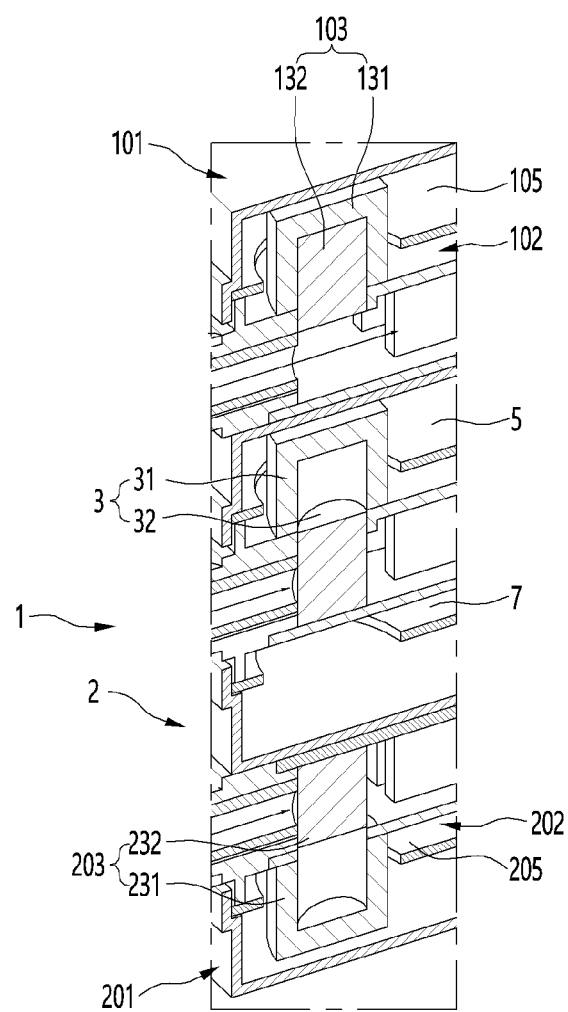
FIG. 15 is an enlarged view when the second control unit shown in FIG. 10 generates heat.

FIG. 15 is an enlarged view when the second control unit shown in FIG. 10 generates heat.

The temperature detected by the temperature sensor provided in the third control board 105 is above the cooling set temperature, and the temperature detected by the temperature sensors provided in each of the first control board 5 and the fourth control board 205 is below the cooling set temperature, the first control board 5 may control the driving source of the first flow valve 3 in a close mode, the third control board 105 may control the driving source of the second flow valve 103 in an open mode, and the fourth control board 205 can control the driving source of the third flow valve 203 in a closed mode.

As shown in FIG. 15, coolant is supplied only to the second coolant jacket 102, and is not supplied to the first coolant jacket 2 and the third coolant jacket 202, and the third control board 105 and the first control board 5 may be cooled.

Figure 16:
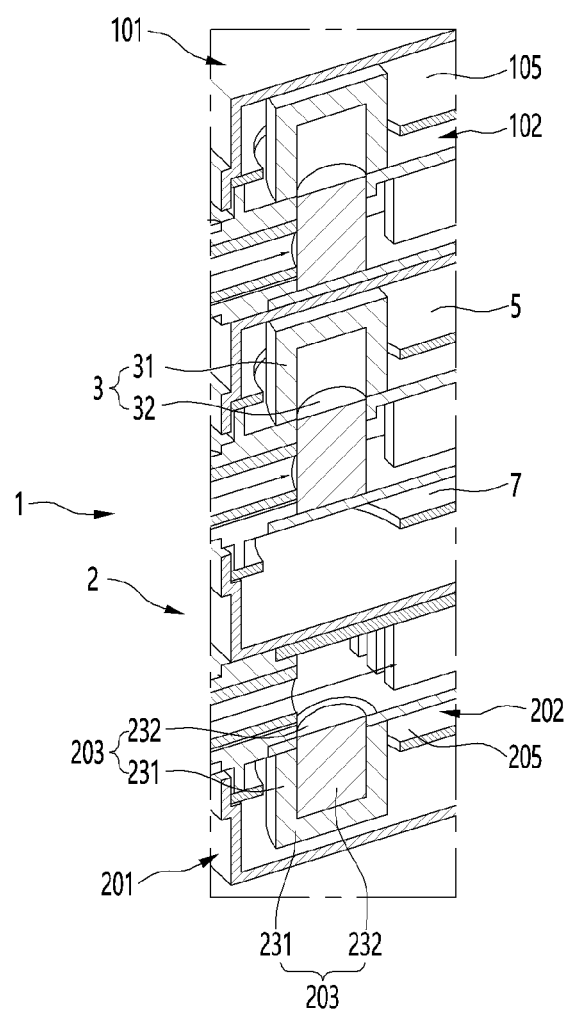
FIG. 16 is an enlarged view when the third control unit shown in FIG. 10 generates heat.

FIG. 16 is an enlarged view when the third control unit shown in FIG. 10 generates heat.

The temperature detected by the temperature sensor provided in the fourth control board 205 is above the cooling set temperature, and the temperature detected by the temperature sensors provided in each of the first control board 5 and the third control board 105 is below the cooling set temperature, the first control board 5 may control the driving source of the first flow valve 3 in a close mode, the third control board 105 may control the driving source of the second flow valve 103 in a close mode, and the fourth control board 205 may control the driving source of the third flow valve 203 in an open mode.

As shown in FIG. 16, coolant is supplied only to the third coolant jacket 202, and is not supplied to the first coolant jacket 2 and the second coolant jacket 102, and the fourth control board 205 and the second board 205 may be cooled.

Figure 17:
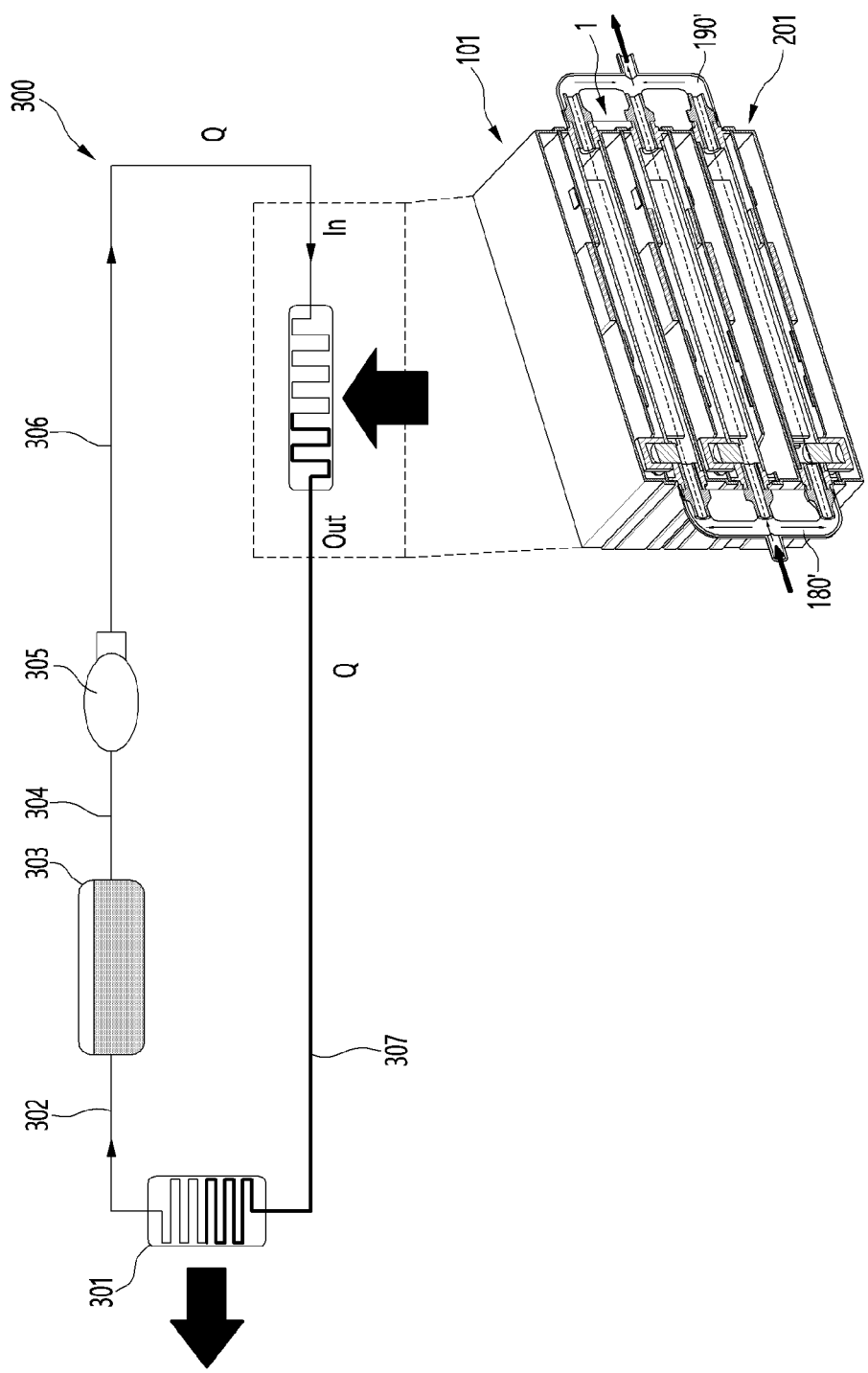
FIG. 17 is a view showing when the electronic control unit according to this embodiment is cooled by a water-cooled cooling device.

FIG. 17 is a view showing when the electronic control unit according to this embodiment is cooled by a water-cooled cooling device.

The water-cooled cooling device 300 shown in FIG. 17 is connected to the electronic control unit and can circulate cold coolant to the electronic control unit.

The water-cooled cooling device 300 may be connected to the electronic control unit through a water pipe.

The water-cooled cooling device 300 comprises a heat exchanger 301, a coolant tank 303 connected to the heat exchanger 301 through the heat exchanger outlet pipe 302, and a pump 305 connected to a coolant tank 303 through pump inlet pipe 304, and a pump outlet pipe 306 connecting the pump 305 and the electronic control unit, and the electronic control unit and the heat exchanger 301 may be connected through the heat exchanger inlet pipe 307.

The heat exchanger 301 can dissipate heat from the coolant into the atmosphere in an air-cooled manner.

The pump outlet pipe 306 may be connected to the inlet nipple 28 of one example of the electronic control unit or the inlet manifold 180 of another example of the electronic control unit, or the inlet manifold 180' of the other example of the electronic control unit.

The heat exchanger inlet pipe 307 may be connected to the outlet nipple 29 of one example of the electronic control unit, the outlet manifold 190 of another example of the electronic control unit, or the outlet manifold 190' of the other example of the electronic control unit.

The coolant may circulate through the heat exchanger and the electronic control unit and dissipate heat in the electronic control unit.

Figure 18:
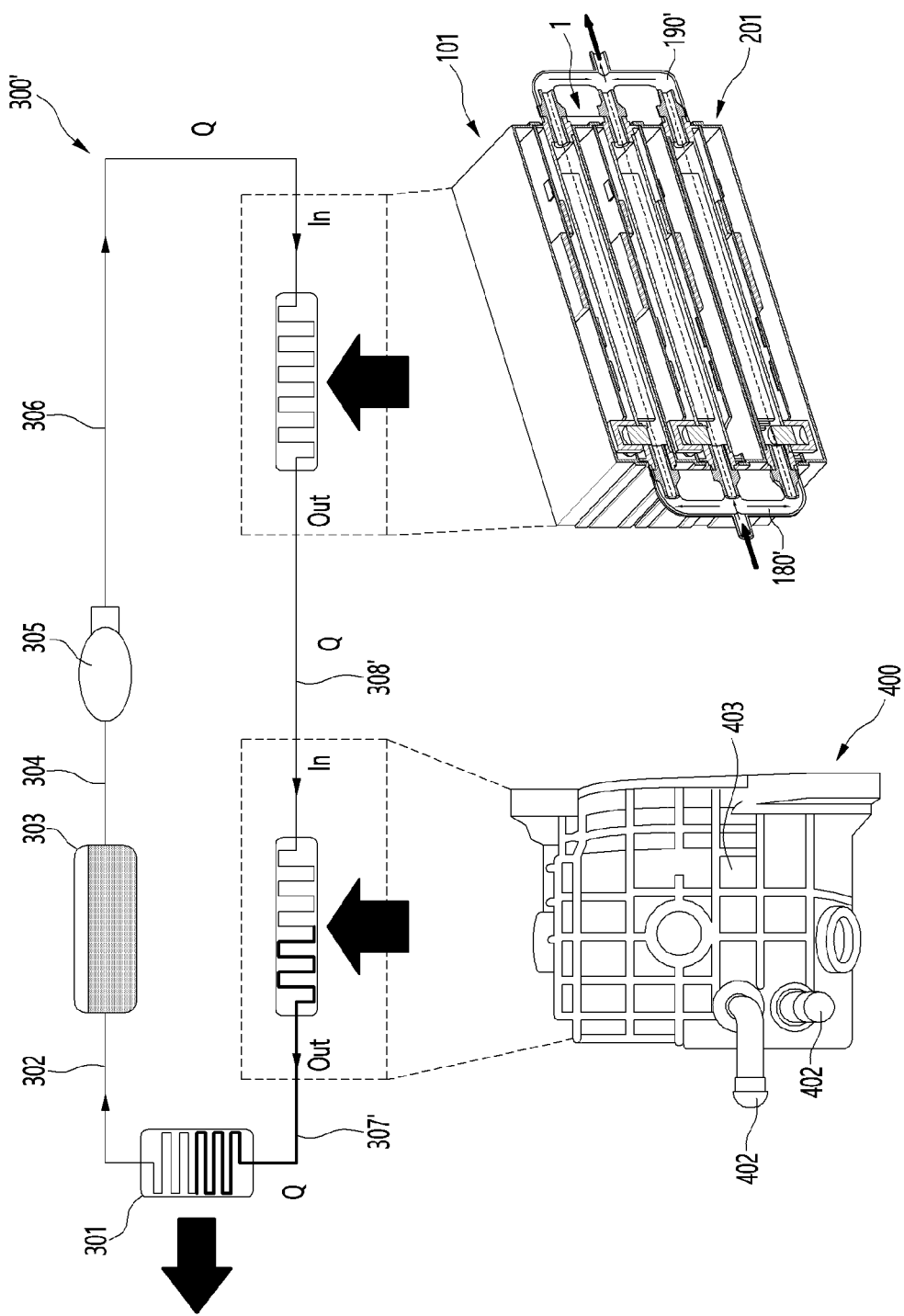
FIG. 18 is a view showing when the electronic control unit and motor according to this embodiment are cooled by a water-cooled cooling device.

FIG. 18 is a view showing when the electronic control unit and motor according to this embodiment are cooled by a water-cooled cooling device.

The water-cooled cooling device 300' shown in FIG. 18 is connected to the electronic control unit and the motor 400, and can circulate cold coolant through the electronic control unit and the motor 400.

An example of the motor 400 may be a drive motor provided in an electric vehicle to provide driving force to the wheels.

The motor 400 may comprise a motor housing 403 in which a coolant inlet port 401 and a coolant outlet port 402 are formed.

The water-cooled cooling device 300' may be connected to the electronic control unit and motor 400 through a water pipe.

The water-cooled cooling device 300' may comprise a heat exchanger 301, a coolant tank 303 connected to the heat exchanger 301 through a heat exchanger outlet pipe 302, and a pump 305 connected to the coolant tank 303 through a pump inlet pipe 304, a pump outlet pipe 306 connecting the pump 305 and the electronic control unit, and the connection pipe 308 connecting the electronic control unit and the motor 400, and the heat exchange 301 and the motor 400 are connected through a heat exchanger inlet pipe 307'.

The heat exchanger 301, the heat exchanger outlet pipe 302, the coolant tank 303, the pump inlet pipe 304, the pump 305, and the pump outlet pipe 306 are same with the water-cooled cooling device 300 as shown in FIG. 17 and its description is omitted to avoid redundant description.

The heat exchanger inlet pipe 307' may be connected to the coolant outlet port 402 of the motor 400.

One end of the connection pipe 308' may be connected to the electronic control unit, such as the outlet nipple 29 in one example of the electronic control unit or the outlet manifold 190 in another example of the electronic control unit, or the outlet manifold 190' in the other example of the electronic control unit.

The other end of the connection pipe 308' may be connected to the coolant inlet port 401 of the motor 400.

The coolant can circulate through the heat exchanger 301, the electronic control unit, and the motor 400, and can sequentially dissipate heat through the electronic control unit and the motor 400.

Figure 19:
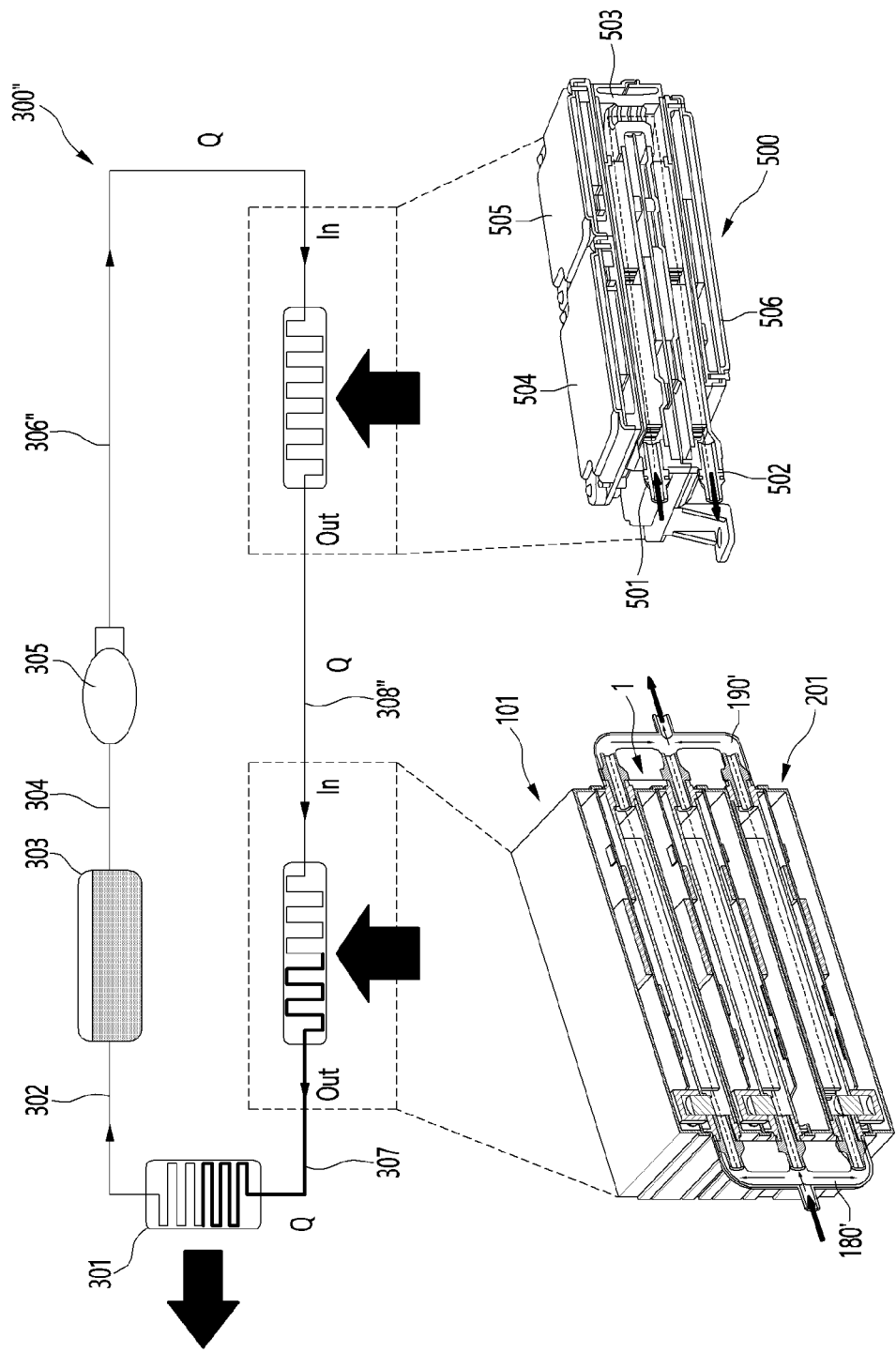
FIG. 19 is a view when the electronic control unit and an additional electronic control unit according to this embodiment are cooled by a water-cooled cooling device.

FIG. 19 is a view when the electronic control unit and an additional electronic control unit according to this embodiment are cooled by a water-cooled cooling device.

The water-cooled cooling device 300" shown in FIG. 19 is connected to the electronic control unit and the additional electronic control unit 500, and can circulate cold coolant to the electronic control unit and the additional electronic control unit 500.

The additional electronic control unit 500 may comprise an additional coolant jacket 503 in which a coolant inlet 501 and a coolant outlet 502 are formed.

An example of the additional electronic control unit 500 may be an electronic control unit provided separately from the electronic control unit, and a plurality of additional control units 504, 505, and 506 may be cooled with one additional coolant jacket 503.

The water-cooled cooling device 300" may be connected to the electronic control unit and the additional electronic control unit 500 through a water pipe.

The water-cooled cooling device 300" may comprise a heat exchanger (301), a coolant tank 303 connected to the heat exchanger 301 and a pump 305 connected to the coolant tank 303 through a pump inlet pipe 304, a pump outlet pipe 305 connecting the pump 304 and the additional electronic control unit 500, and the connection pipe 308" connecting the additional electronic control unit 500 and the electronic control unit, and the electronic control unit and the heat exchanger 301 are connected through the heat exchanger inlet pipe 307.

The heat exchanger 301, the heat exchanger outlet pipe 302, the coolant tank 303, the pump inlet pipe 304, the pump 305, and the heat exchanger inlet pipe 307 are same with the water-cooled cooling device 300 as shown in FIG. 17 and its description is omitted to avoid redundant description.

One end of the pump outlet pipe (306") may be connected to the outlet of the pump 305.

The other end of the pump outlet pipe 306" may be connected to the coolant inlet 501 of the additional electronic control unit 500.

One end of the connection pipe (308") may be connected to the coolant outlet 502 of the additional electronic control unit 500.

The other end of the connection pipe 308" may be connected to the inlet nipple 28 of one example of the electronic control unit, the inlet manifold 180 of another example of the electronic control unit, or the inlet manifold 180' of the other example of the electronic control unit.

The coolant may circulate through the heat exchanger 301, the additional electronic control unit 500, and the electronic control unit, and can sequentially dissipate heat through the additional electronic control unit 500 and the electronic control unit.

The coolant may flow through the passage at a specific flow rate Q by the pump 305, and the coolant may flow into the additional electronic control unit 500, cool the heat source of the additional electronic control unit 500, and then flow out of the additional electronic control unit 500.

The coolant flow out of the additional electronic control unit 500 may flow into the inlet of the electronic control unit, may cool each of heat sources of the plurality of control units 1,101 and 102 connected in parallel, and may flow out of the electronic control unit after combining.

The coolant may fall to the initial temperature while passing through the heat exchanger 301, and the coolant may be stored in the coolant tank 303.

The above process may be repeated for the coolant stored in the coolant tank 303.

According to this embodiment, since the first coolant jacket disposed between the first control board and the second control board can cool the first control board and the second control board together, the structure is simple and compactization is possible compared to the case the first control board and the second control board are cooled by the individual coolant jackets.

In addition, since the first coolant jacket comprises a first jacket body and a first cover, it easy to clean or service the coolant flow path or the first flow valve.

In addition, the autonomous driving board of the vehicle and the infotainment board of the vehicle are spaced apart vertically, so when one of the autonomous driving board of the vehicle and the infotainment board of the vehicle breaks down, only a broken board can be replaced or repaired. The autonomous driving board vehicle and the infotainment board vehicle can be selectively updated.

In addition, the valve housing is penetrated into the through hole formed in at least one of the first control board or the second control board, so the valve housing can be received in the first case together with the first control board, or received in the second control board with the second control board, and it possible to compact the electronic control unit.

In addition, since the valve body of the first flow valve passes through the valve hole formed in the first coolant jacket, all or part of the valve housing can be located outside the first coolant jacket, and the thickness of the first coolant jacket can be minimized.

In addition, the second control unit may be disposed on the upper or lower surface of the first control unit to expand the electronic control unit, and the second coolant jacket of the second control unit may cool the third control board and the first control board together, the cooling performance of the first control board is high.

In addition, since the second control unit and the third control unit are disposed on both sides of the first control unit, the electronic control unit can be expanded, the second coolant jacket of the second control unit can cool the third control board and the first control board together, and the cooling performance of the first control board is high. And the third coolant jacket of the third control unit can cool the second control board and the fourth control board together, and the cooling performance of the second control board is high.

In addition, since the first flow valve provided in the first control unit, the second flow valve provided in the second control unit, and the third flow valve provided in the third control unit can independently adjust the flow rate of the coolant, the electronic control unit can increase the flow rate of coolant supplied to a control unit containing a low heat source and can decrease the flow rate of coolant supplied to a control unit containing a low heat source, and the electronic control unit can perform an efficient cooling function.

The above description is merely an example of the technical idea of the present invention, and various modifications and variations can be made to those skilled in the art without departing from the essential characteristics of the present invention.

Therefore, the embodiments disclosed in the present invention are not intended to limit the technical idea of the present invention, but to explain, and the scope of the technical idea of the present invention is not limited by these embodiments.

The protection scope of the present invention should be construed according to the claims below, and all technical ideas within the equivalent range should be construed as being comprised in the scope of the present invention.

What is claimed is:

1. An electronic control unit comprising:
at least one control unit including a first control unit,
wherein the first control unit comprises:
a first coolant jacket having an inlet and an outlet, a coolant passage through which coolant passes, and a plurality of cooling fins;
a first flow valve controlling the coolant passage of the first coolant jacket;
a first case disposed above the first coolant jacket;
a first control board accommodated in a space formed between the first coolant jacket and the first case;
a second case disposed below the first coolant jacket; and
a second control board accommodated in a space formed between the first coolant jacket and the second case,
wherein the first control board is an autonomous driving board of a vehicle,
wherein the second control board is an infotainment board of the vehicle,
wherein the first control board and the second control board are spaced apart vertically, and the first coolant jacket is interposed between the first control board and the second control board,
wherein the first flow valve comprises:
a valve housing;
a valve body disposed to be raised or lowered within the valve housing and into the coolant passage of the first coolant jacket; and
a driving source configured to raise or lower the valve body, and
wherein at least one of the first control board or the second control board includes a through hole through which the valve housing passes.

2. The electronic control unit according to claim 1, wherein the first coolant jacket comprises:
a first jacket body including the inlet, the outlet, the coolant passage and the plurality of cooling fins; and
a first cover coupled to the jacket body and covering the coolant passage and plurality of cooling fins.

3. The electronic control unit according to claim 1, wherein the first control unit further comprises a thermal pad disposed between an upper surface of the first coolant jacket and a lower surface of the first control board.

4. The electronic control unit according to claim 1, wherein the first control unit further comprises a thermal pad disposed between a lower surface of the first coolant jacket and an upper surface of the second control board.

5. The electronic control unit according to claim 1, wherein the first coolant jacket includes a valve hole through which the valve body passes.

6. An electronic control unit comprising:
at least one control unit including a first control unit,
wherein the first control unit comprises:
a first coolant jacket having an inlet and an outlet, a coolant passage through which coolant passes, and a plurality of cooling fins;
a first flow valve controlling the coolant passage of the first coolant jacket;
a first case disposed above the first coolant jacket;
a first control board accommodated in a space formed between the first coolant jacket and the first case;
a second case disposed below the first coolant jacket; and
a second control board accommodated in a space formed between the first coolant jacket and the second case,
wherein the first control board is an autonomous driving board of a vehicle,
wherein the second control board is an infotainment board of the vehicle,
wherein the first control board and the second control board are spaced apart vertically, and the first coolant jacket is interposed between the first control board and the second control board,
wherein the at least one control unit comprises a second control unit disposed above or below the first control unit, and
wherein the second control unit comprises:
a second coolant jacket having an inlet and an outlet, a coolant passage through which coolant passes, and a plurality of cooling fins;
a second flow valve controlling the coolant passage of the second coolant jacket;
a third control board disposed on the second coolant jacket; and
a third case covering the third control board.

7. The electronic control unit according to claim 6, wherein the second coolant jacket comprises:
a second jacket body including the inlet and the outlet, the coolant passage and the plurality of cooling fins; and
a second cover covering the coolant passage and the plurality of cooling fins.

8. The electronic control unit according to claim 6, wherein the second control unit comprises a thermal pad disposed between the second coolant jacket and the third control board.

9. The electronic control unit according to claim 6, wherein the second flow valve comprises:
   a valve housing;
   a valve body disposed to be raised or lowered within the valve housing and into the coolant passage of the second coolant jacket; and
   a driving source configures to raise and lower the valve body, and
   wherein the third control board includes a through hole through which the valve housing passes.

10. The electronic control unit according to claim 9, wherein the second coolant jacket includes a valve hole through which the valve body passes.

11. The electronic control unit according to claim 6, further comprising:
    an inlet manifold connected to each of the inlet of the first coolant jacket and the inlet of the second coolant jacket; and
    an outlet manifold connected to each of the outlet of the first coolant jacket and the outlet of the second coolant jacket.

12. The electronic control unit according to claim 6, wherein the at least one control unit comprises a third control unit spaced apart from the second control unit, and
    wherein the third control unit comprises:
      a third coolant jacket having an inlet and an outlet, a coolant passage through which the coolant passes, and a plurality of cooling fins;
      a third flow valve controlling the coolant passage of the third coolant jacket;
      a fourth control board disposed on the third coolant jacket; and
      a fourth case covering the fourth control board.

13. The electronic control unit according to claim 12, wherein the third coolant jacket comprises:
    a third jacket body including the inlet, the outlet, the coolant passage, and the plurality of cooling fins; and
    a third cover covering the coolant passage and the plurality of cooling fins.

14. The electronic control unit according to claim 12, wherein the third control unit comprises a thermal pad disposed between the third coolant jacket and the fourth control board.

15. The electronic control unit according to claim 12, wherein the third flow valve comprises:
    a valve housing;
    a valve body disposed to be raised or lowered within the valve housing and into the coolant passage of the third coolant jacket; and
    a driving source configured to raise or lower the valve body, and
    wherein the fourth control board includes a through hole through which the valve housing passes.

16. The electronic control unit according to claim 15, wherein the third coolant jacket includes a valve hole through which the valve body passes.

17. The electronic control unit according to claim 12, further comprising:
    an inlet manifold connected to each of the inlet of the first coolant jacket, the inlet of the second coolant jacket, and the inlet of the third coolant jacket; and
    an outlet manifold connected to each of the outlet of the first coolant jacket, the outlet of the second coolant jacket, and the outlet of the coolant jacket.

18. An electronic control unit comprising:
    at least one control unit including a first control unit,
    wherein the first control unit comprises:
      a first coolant jacket having an inlet and an outlet, a coolant passage through which coolant passes, and a plurality of cooling fins;
      a first flow valve controlling the coolant passage of the first coolant jacket;
      a first case disposed above the first coolant jacket;
      a first control board accommodated in a space formed between the first coolant jacket and the first case;
      a second case disposed below the first coolant jacket; and
      a second control board accommodated in a space formed between the first coolant jacket and the second case,
    wherein the first control board is an autonomous driving board of a vehicle,
    wherein the second control board is an infotainment board of the vehicle,
    wherein the first control board and the second control board are spaced apart vertically, and the first coolant jacket is interposed between the first control board and the second control board,
    the electronic control unit further comprising:
      a second control unit; and
      a third control unit spaced apart from the second control unit,
    wherein the second control unit comprises:
      a second coolant jacket disposed above the first control unit and having a coolant passage through which coolant passes;
      a second flow valve that opens or closes the coolant passage of the second coolant jacket; and
      a third control board cooled by the second coolant jacket, and
    wherein the third control unit comprises:
      a third coolant jacket disposed below the first control unit and having a coolant passage through which the coolant passes;
      a third flow valve that opens or closes the coolant passage of the third coolant jacket; and
      a fourth control board cooled by the third coolant jacket.

* * * * *